United States Patent [19]

Miller

[11] 4,295,037

[45] Oct. 13, 1981

[54] PRODUCTION COUNTER APPARATUS

[76] Inventor: Gary L. Miller, 16497 Terra Bella, Mt. Clemens, Mich. 48044

[21] Appl. No.: 32,124

[22] Filed: Apr. 23, 1979

[51] Int. Cl.³ .......................... G06M 3/08; G07C 3/10
[52] U.S. Cl. .............................. 235/92 PD; 235/92 Q; 235/92 FQ; 235/92 EA
[58] Field of Search ........ 235/92 PD, 92 FQ, 92 QC, 235/92 EA, 92 TF, 92 ST, 92 T, 92 AC

[56] References Cited

U.S. PATENT DOCUMENTS

| | | | |
|---|---|---|---|
| 2,663,495 | 12/1953 | Ramsell et al. | 235/61 |
| 3,372,379 | 3/1968 | Collom et al. | 235/92 PD |
| 3,593,008 | 7/1971 | DeWitt et al. | 235/92 PD |
| 3,594,643 | 7/1971 | Hunt | 235/92 EA |
| 3,670,147 | 6/1972 | Wright | 235/92 PD |
| 3,876,867 | 4/1975 | Schull et al. | 235/92 T |
| 4,041,281 | 8/1977 | Gaudeul | 235/92 PD |
| 4,123,896 | 11/1978 | Asano et al. | 235/92 T |
| 4,142,238 | 2/1979 | Brandt et al. | 235/92 PD |

Primary Examiner—Joseph M. Thesz
Attorney, Agent, or Firm—Basille, Weintraub & Hanlon

[57] ABSTRACT

A production counter apparatus suitable for use as a production counter in a manufacturing operation. The counter assembly includes a plurality of identical electronic counters, each operative to provide a count of the number of occurrences of a selected event. Digital displays are associated with each counter for displaying the respective counts. Control circuitry is provided for controlling the operation of each counter insofar as providing resetting of the counter and also temporarily holding the displayed count while the counter continues to update current count totals.

6 Claims, 7 Drawing Figures

PRODUCTION COUNTER APPARATUS

BACKGROUND OF THE INVENTION

1. Field of the Invention

This invention relates, in general, to counting apparatus and, more specifically, to electronic counting apparatus for counting parts produced in a manufacturing operation.

2. Description of the Prior Art

In a manufacturing plant operation involving the production of parts, it is necessary to obtain an accurate count of the parts produced for both inventory and cost control. In such an operation, it is common to provide the counts of both good and waste parts produced by selected manufacturing equipment. Such counts are typically recorded by mechanical, clutch-driven counters which are selected by manually operated selector switches so as to respectively count either the good or waste parts produced. Although mechanical counters have performed satisfactorily in many manufacturing operations, their use has several drawbacks. For one, the mechanical counters are comprised of mechanical parts which are subject to wear over long periods of use such that the reliability of such counters is relatively low. Furthermore, the use of such mechanical parts inherently reduces the accuracy of the count totals. In addition, mechanical counters cannot temporarily hold a count while continually up-dating subsequent count pulses; it being desirable in certain instances to temporarily freeze the displayed count. Finally, it is often desirable in manufacturing plant operations to remotely locate production counters far from the actual manufacturing operation for supervisory functions, such as that shown in U.S. Pat. No. 2,663,495. However, in so doing, individual control lines and counters are needed to remotely locate such counters from each individual manufacturing operation.

Thus, it would be desirable to provide counting apparatus for counting parts produced in a manufacturing plant which is more accurate, has higher reliability, is more flexible in terms of temporarily freezing the displayed production counts and also is able to be more conveniently located remote from the manufacturing site than the mechanical counters utilized extensively in the past.

Electronic counters have also been utilized in situations requiring high accuracy and reliability. However, such electronic equipment is extremely sensitive to the heat, dirt and vibrations common in most manufacturing plants and therefore, care must be taken in the placement and use of such electronic counters. Thus, it would be desirable to provide a production counter apparatus suitable for use in a manufacturing plant for counting and displaying production part counts. It would also be desirable to provide a production counter apparatus for use in a manufacturing plant which can be easily protected from the extreme conditions of heat, dirt and vibrations existant in the manufacturing plants. Finally, it would be desirable to provide a production counter apparatus which is extremely flexible insofar as selecting which events are to be monitored and, also, temporarily freezing the displayed count while the associated counter continues to up-date current count totals.

SUMMARY OF THE INVENTION

Herein disclosed is a new and improved production counter apparatus suitable for use as a production counter in a manufacturing plant operation. The counter assembly includes a plurality of identical electronic counters, each operative to provide a count of the number of occurrences of a different selected event. Digital displays are associated with each counter for displaying the respective counts. Control circuitry is also provided for controlling the operation of each counter insofar as providing resetting and temporarily freezing the displayed count while the counter continues to up-date the current count totals.

Specifically, the individual electronic counters are utilized for counting total parts produced in a production press, as well as the number of good and waste parts produced. Also, a counter is utilized to provide an indication of the speed of the press for both maintenance and production rate purposes. The counters are mounted in a main control panel which is located adjacent to the production press. An auxiliary panel is attached to the press and contains a selector switch enabling the operator to select between good and waste parts depending upon the condition of the parts produced in the press. Additional counters for good and waste part counts as well as the speed of a press are mounted in another control panel along with similar counters for other presses; with the panel mounted remote from the individual presses for easy supervision of the manufacturing operation. A selector switch selects which presses are to be monitored and whose production counts and speed are displayed on the control panel.

The production counting apparatus of this invention is ideally suited for use in a manufacturing plant operation insofar as providing accurate and reliable production count information through the use of electronic components. Further, the electronic counter may be conveniently located remote from the actual manufacturing operation being monitored. In this manner, the sensitive electronic components utilized in the counting apparatus in this invention can be located away from the source of vibration, dirt and heat associated with the manufacturing operation in question.

DESCRIPTION OF THE DRAWING

The various features, advantages and other uses of this invention will become more apparent by referring to the detailed description and drawing in which.

DESCRIPTION OF THE PREFERRED EMBODIMENT

Throughout the following description, identical reference numbers refer to the same component shown in multiple figures of the drawings.

Figure 1:
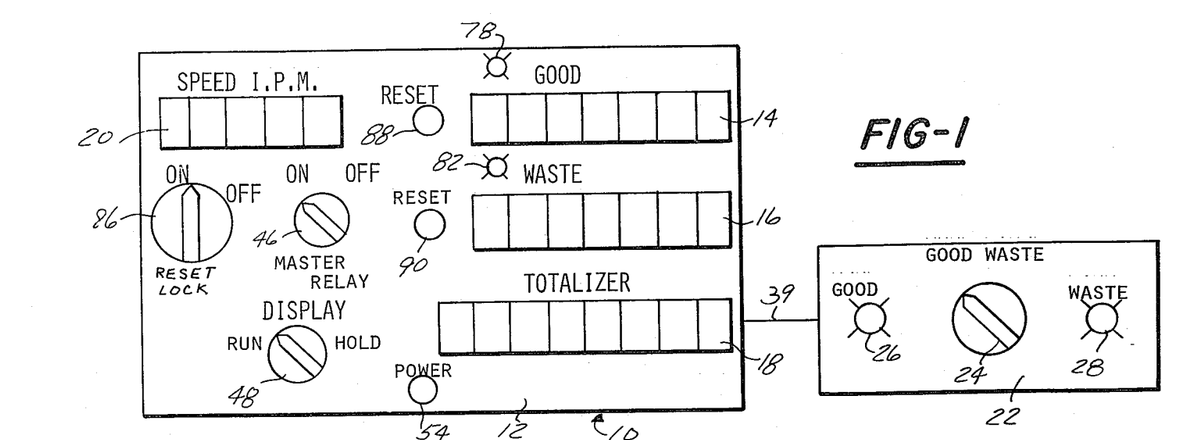
FIG. 1 is a pictorial representation of the control panel for an electronic counter constructed according to the teaching of this invention.

Referring now to the drawings, and to FIG. 1 in particular, there is shown a control panel 12 of a production counter apparatus 10 constructed according to the teachings of this invention. The production counter 10 is suitable for use with production equipment in a manufacturing plant, such as a stamping or welding press, wherein a multitude of parts are sequentially produced. Such equipment has the need for an accurate count of the good and waste parts produced, the total number of parts produced as well as the speed of each individual press. So as to provide a convenient display of such counts, the control panel 12 of the counter 10 is located adjacent to the press. As shown in FIG. 1, the main control panel 12 includes digital displays 14, 16, 18 and 20 which provide a display of the total number of good parts, waste parts, total parts and the speed of the press, respectively. In addition, the control panel 12 has mounted thereon a plurality of control switches for starting, resetting and temporarily freezing the displayed counts, as described hereafter.

Also shown in FIG. 1 is an auxiliary control panel 22 which is located near the delivery side of the press. Mounted on the control panel 22 is a selector switch which is switchable between two positions, labeled good and waste, respectively, and indicator lights which indicate whether the selector switch 24 is in either the good or waste position. Control signals from the selector switch 24 are carried through control line 39 to the main control panel 12. The control panel 22 enables the press operator to indicate whether good or waste parts are being produced in the press.

Figure 2:
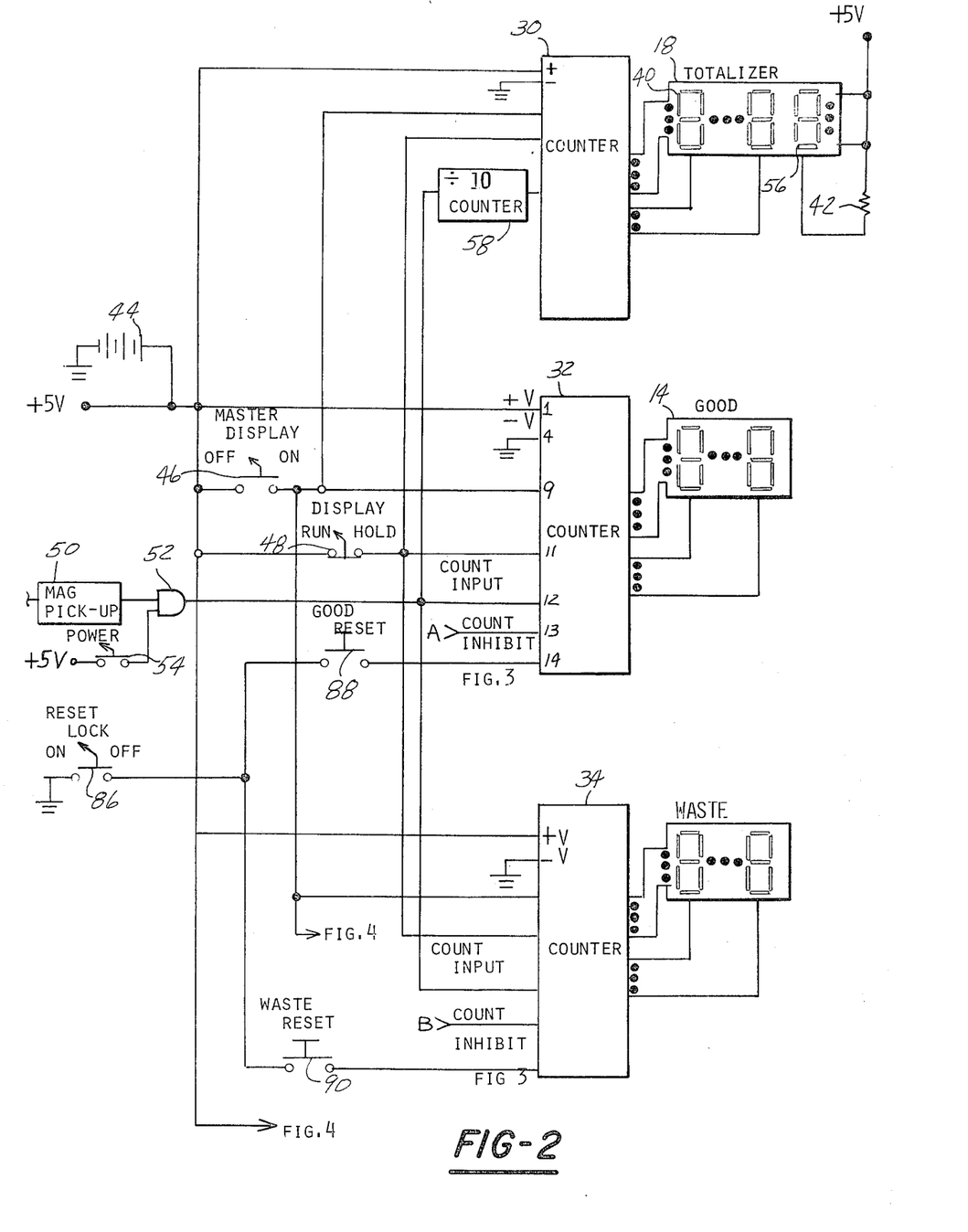
FIGS. 2, 3 and 4 are schematic and block diagrams of the electronic counter of this invention.
Figure 3:
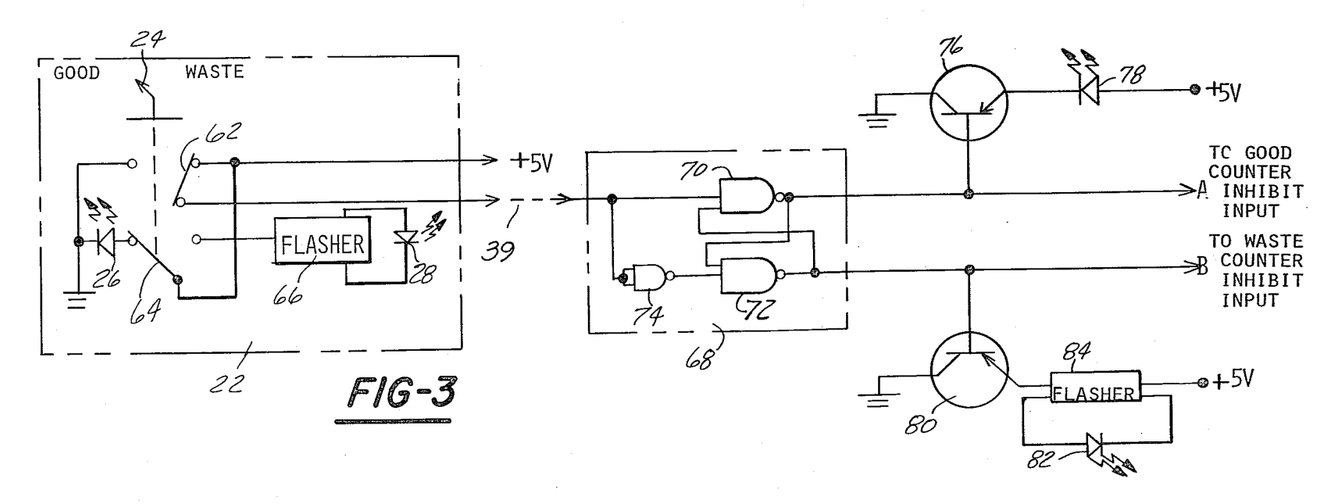
Figure 4:
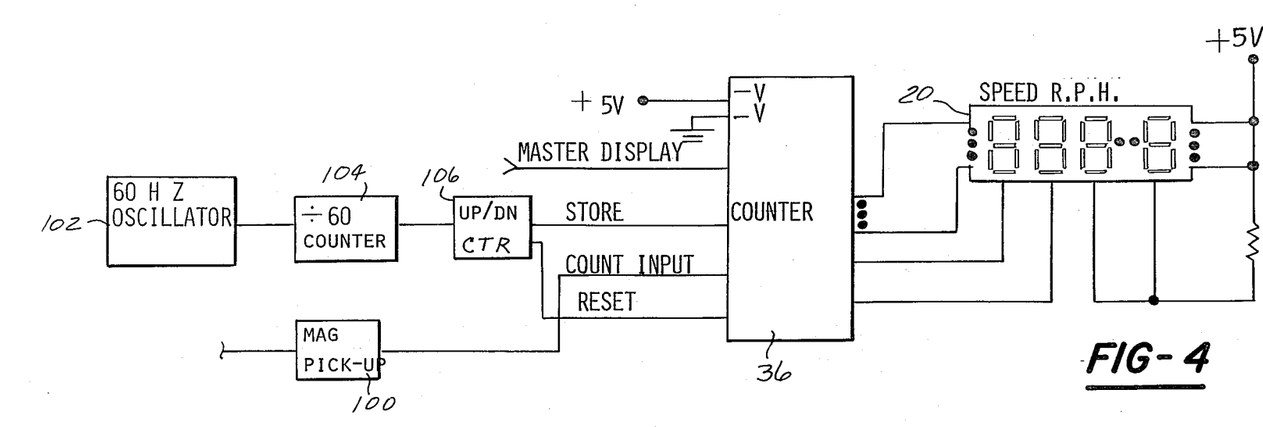

Referring now to FIGS. 2, 3 and 4, there is shown the detailed circuitry of the production counter 10. The production counter apparatus 10 includes four individual counters 30, 32, 34 and 36 which respectively count the number of occurrences of a selected event, such as the production of the parts in a manufacturing press. Specifically, the counters 30, 32, 34 and 36 count the total number of parts produced on the press, as well as the good and waste parts produced and the speed of the press respectively. Associated with each counter 30, 32, 34 and 36 is a digital display 14, 16, 18 and 20, respectively which provides an indication of the individual counts of each counter 30, 32, 34 and 36. The counters 30, 32, 34 and 36 each comprise a seven decade counter formed on a single integrated circuit chip which also contains the segment drivers for the digital displays and additional logic for displayed blanking, reset, input inhibit and display on and off functions. Although any suitable counter may be utilized to form the electronic counter apparatus of this invention, a counter chip manufactured by Intersil Corporation, Cupertino, California, Model No. ICM7208, it utilized in the preferred embodiment of this invention.

The displays 14, 16, 18 and 20 are multi-digit, common cathode, LED-type displays. In order to provide the desired production count capacity, the totalizer display 18 includes eight individual digits, such as digit 40, shown in FIG. 2. The seven most significant digits of the totalizer count display are connected to the outputs of counter 30; while the least significant digit is fixed to continuously display a zero, which gives the totalizer display 18 the capacity to display a count of 99,999,990. The good and waste count displays 14 and 16, respectively, comprise seven digits so as to provide a maximum count of 9,999,999. The press speed display 20 shown in FIG. 4, includes five individual digits, with the three least significant digits connected so as to continuously display a zero.

The anode outputs of each counter, such as counter 30, are connected to the corresponding segments of each digit, such as digit 40 of the totalizer display 18, shown in FIG. 2, with the corresponding output connected to the corresponding segment of the display. In addition, the cathode outputs of each counter are connected to the respective common cathode of each individual display digit. Regarding the display digits which are continuously fixed at zero, a +5 volt source is connected to the appropriate segments of the display digit so as to form a zero, with the cathode of the particular display digit connected through a dropping resistor 42 to the same +5 V supply. As mentioned previously, associated with each counter 30, 32, 34 and 36 are counter controls which generally provide the functions of starting, turning the display on and off, resetting the counters, inhibiting a particular counter from counting and temporarily freezing the display of a particular counter while the counter continues to up-date current count totals. As shown in FIGS. 2 and 4, each counter 30, 32, 34 and 36 is connected to an appropriate supply voltage, +5 V in the preferred embodiment of this invention. In addition, a stand by battery source 44 is provided to power the counter apparatus 10 in the event that the power supply providing +5 V input fails.

As shown in FIG. 2 and symbolically on the face of the control panel 12 in FIG. 1, the counter controls include the master display on/off selector switch 46. The master display selector switch 46 is switchable between on and off states so as to connect or disconnect the counters 30, 32, 34 and 36 to the source of supply voltage. A display run/hold selector switch 48 is also provided to connect the +5 V source to the store input of each counter 30, 32, 34 shown in FIG. 2. When the display switch 48 is in the run mode, each counter 30, 32 and 34 continuously up-dates the associated display on each negative transition of the respective input signal to each counter. When the display switch 48 is switched to the hold position, the display associated with each counter is held at the last value prior to the switching of the display switch 48 to the hold position. Although the display is temporarily frozen, each counter continues to up-date current counts and, when the display switch 48 is switched back to the run position, each counter up-dates its respective display to then current count.

The count input to the good, waste and totalizer counters 32, 34 and 30 respectively, is provided by a conventional magnetic pick-up 50 which is connected to the press and provides a pulse or output signal once during each cycle of the press in order to indicate the production of one part. Although magnetic pick-up 50 is illustrated, many conventional sensing devices, such as a limit switch or proximity switch, may also be used to indicate the production of a part. The output from the magnetic pick-up 50 is input to a Schmitt trigger gate 52 along with the output of a power selector switch 54 which provides power to the count inputs, thereby turning each counter on or off. When both inputs to the Schmitt trigger 52 are present at a high logic level, the output of the Schmitt trigger 52 will also be high. Thus, a count input pulse will be provided to each counter 30, 32 and 34 upon each negative transition of the input signal from the magnetic pick-up 50. Regarding the totalizer counter 30, since the last digit 56 of the totalizer display 18 is continuously fixed at zero, a divide by ten counter 58 is connected between the output of the Schmitt trigger 52 and the count input of the totalizer counter 30 so as to provide an input pulse to the counter 30 upon every 10 transitions or parts produced as indicated by the transition of the signal from the magnetic pick-up 50.

Referring now to FIG. 3, there is shown the count inhibit circuitry associated with the good and waste part counters 32 and 34, respectively, shown in FIG. 2. As described previously, the auxiliary panel 22 contains a selector switch 24 which enables the press operator to select between good and waste part production, providing an indication thereof of the conditions of the parts produced in the press. The selector switch 24 includes two switchable contacts 62 and 64, each switchable between first and second positions. When the selector switch 24 is in the first or good position, the +5 volt supply is connected through contact 64 to the LED 26, which is mounted on the face of the auxiliary panel 22 to provide an indication that good parts are currently being produced. In addition, control line 39 from the auxiliary panel 32 will be at a high logic level. When the selector switch 24 is switched to the second or waste position, the control line 39 is at a low logic level since ground is connected through contact 62 to the control line 39. At the same time, power is supplied through contact 64 to a flasher unit 66 to which is connected the LED 28. The flasher unit 66, which is any conventional type flasher suitable for use with LED's, provides a pulsating signal to the LED 28 thereby indicating that waste parts are being produced within the press.

The output signal from the auxiliary panel 22 indicating either good or waste part production, is carried on control line 39, to debounce circuitry 68 contained within the main panel 12. The debounce circuitry 68 comprises NAND gates 70 and 72 arranged in flip-flop configuration, with the control line 30 being connected as an input to NAND gate 70 and also to NAND gate 72 through NAND gate 74.

In operation, when the selector switch 24 in the auxiliary panel 22 is switched to the good position, the control line 30 will be at a high logic level as described above, which thereby triggers the flip-flop in the debounce circuitry 68 so as to provide, at the A control line output thereof, a low level signal. As shown in FIG. 2, the control line A is connected to the count inhibit pin of the good part counter 32 which thereby acts to remove the inhibit from the counter 32 and enables counter 32 to continuously up-date the part counts on each negative transition of the count input signal. In addition, when control line A switches to a low logic level transistor 76 is gated to an "on" condition thereby providing a path for current flow from the +5 Volt supply through LED 78 to provide an indication on the face of the control panel 12, FIG. 1, of good part production. At the same time the control line A is a low logic level, control line B, which is connected to the count inhibit pin of the waste part counter 34, FIG. 2, is changed to a high logic level which thereby inhibits the counting function of counter 34.

In a similar manner, when selector switch 24 and the auxiliary panel 22 is switched to the waste position thereby indicating the production of waste or bad parts, control line B, through the debounce circuitry 68, will be switched to a low logic level thereby removing the inhibit on the waste part counter 34, FIG. 2, and permitting the counting of waste parts. At the same time, the low logic level present on control line B gates transistor 80 to an "on" condition thereby providing a current flow path through the LED 82. A flasher unit 84 is associated with LED 82 to provide a pulsating signal during the production of waste parts. When control line B is at a low logic level, control line A is a high logic level which thereby inhibits good part counter 34 from counting additional production.

Referring again to FIGS. 1 and 2, there are provided on the face of the control panel 12 of the counter apparatus 10 of this invention a reset lock selector switch 86, which is switchable between on and off positions, as well as reset buttons 88 and 90, respectively associated with good and waste part counters 32 and 34. The activation of the reset buttons 88 and 90 when the reset lock selector switch 86 is in the off position, respectively resets counters 32 and 34 to zero. When the reset lock selector switch is in the "on" position, the good and waste reset buttons 88 and 90, respectively, are deactivated such that their being depressed will have no effect upon the state or count contained within counters 32 and 34.

Referring now to FIG. 4, there is shown the portion of the counter apparatus 10 that provides an indication of the speed of a particular press. The counter 36 illustrated in FIG. 4 is the same as the counters shown in FIG. 2 and is connected to the same supply voltage and master display on/off selector switch. The anode and cathode outputs from the counter 36 are connected to the two most significant digits of the speed displayed 20, with the three least significant digits connected to provide an continuous zero output. The count input to the counter 36 is provided by a conventional magnetic pick-up 100 which provides 36 pulses for each single revolution of the press. A crystal oscillator 102 provides pulses at a 60 Hz. frequency to a divide-by-60 counter 104. Counter 104 provides an output signal for every 60 input pulses from the oscillator 102 to an up/down counter 106. In this manner, a one second window is created during which the pulses from the magnetic pick-up 100 are counted and displayed on the speed display 20. The output of the up/down counter 106 is connected to the store input of counter 36 so as to temporarily freeze the display 20 while the counter 36 is reset to zero and the next series of pulses from the magnetic pick-up 100 are being inputted and counted by the speed counter 36. Since the second and third cathode outputs of the speed counter 36 are connected to the second and first elements of the display 20 and the last three elements are fixed at zero, the number of pulses counted by counter 36 is automatically converted to the number of revolutions per hour of a press.

Figure 5:
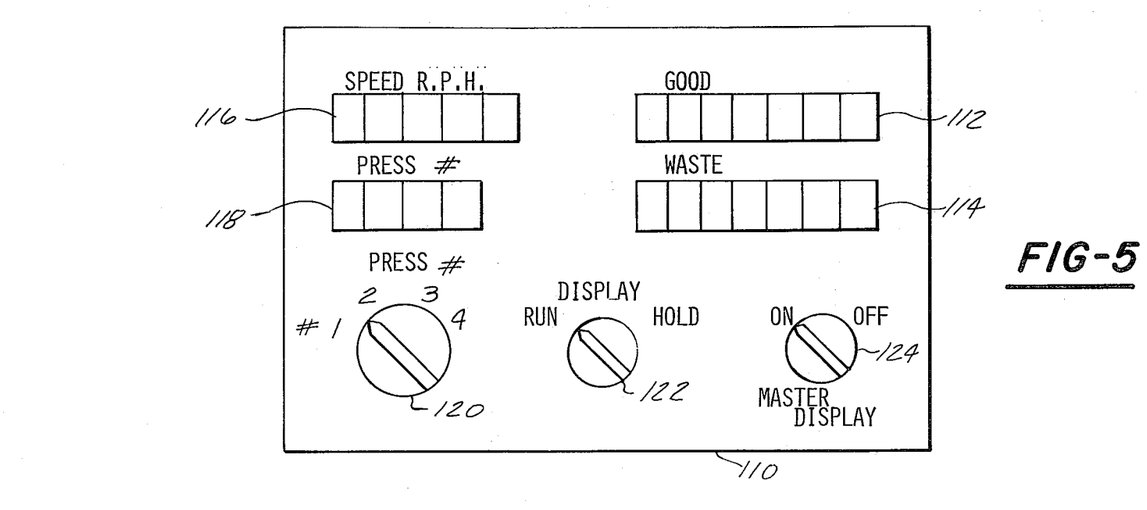
FIG. 5 is a pictorial representation of a control panel of an electronic counter constructed according to another embodiment of this invention.
Figure 6A:
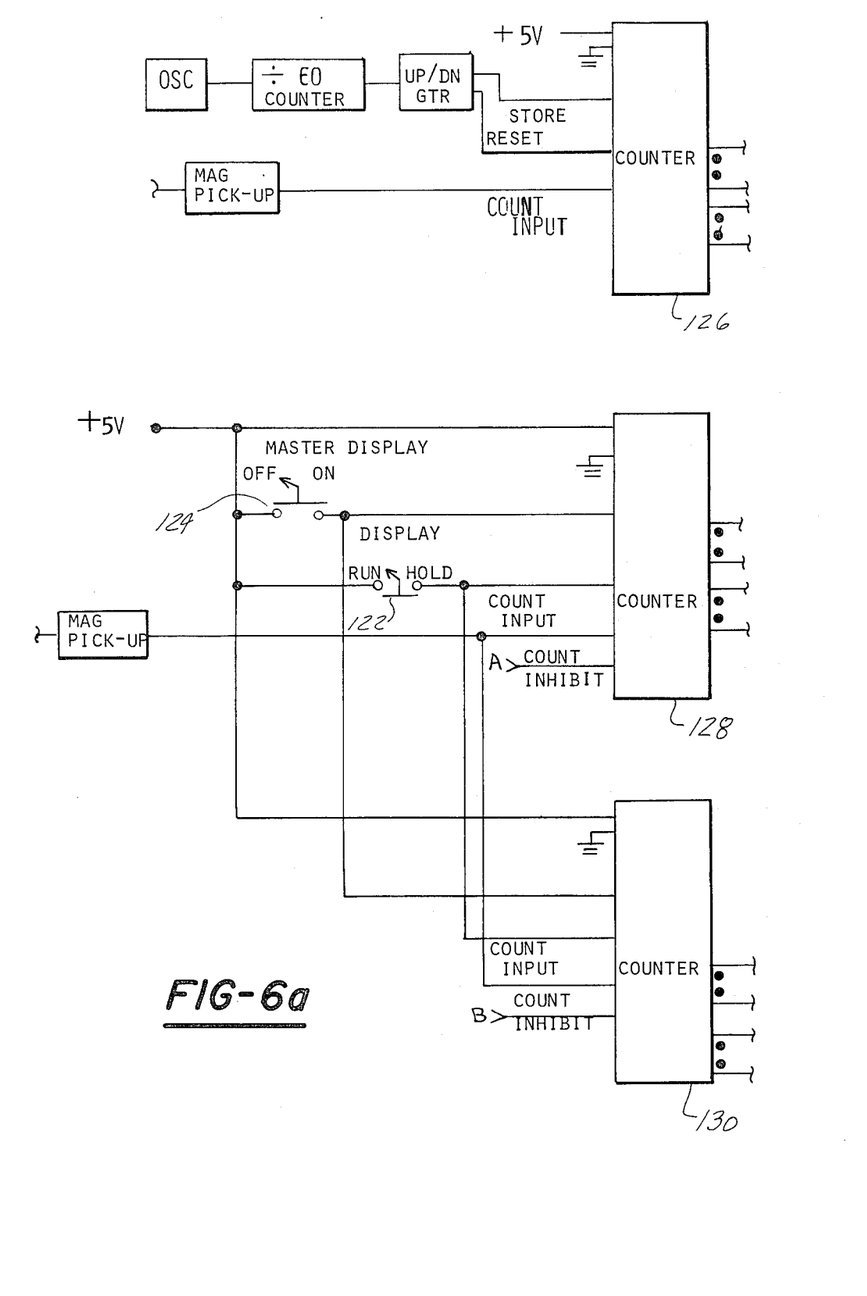
FIGS. 6a and 6b is a block and schematic diagram of the circuitry forming the electronic counter associated with the control panel shown in FIG. 5.
Figure 6B:
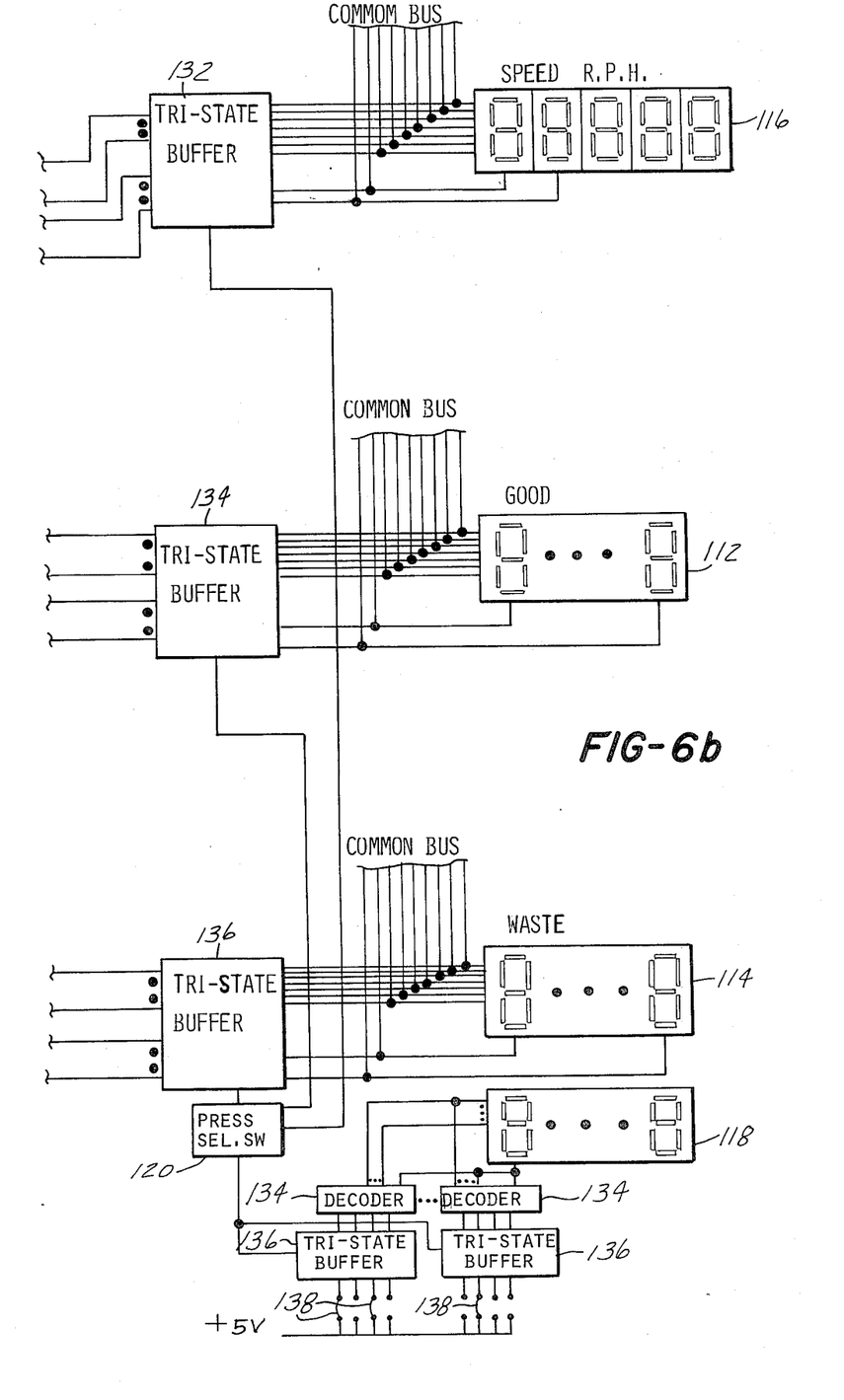

Referring now to FIGS. 5 and 6a and 6b, there is shown a remote control panel 110 and associated counter circuitry constructed according to another embodiment of this invention. The control panel 110 may be located remote from the actual manufacturing operation or press site, such as in an office, so as to provide easy supervision of a multitude of individual presses. As shown in FIG. 5, the remote control panel 110 includes seven digit good and waste part count displays 112 and 144, respectively, as well as a five digit speed display 116 and a four digit press number display 118. A press number selector switch 120 is provided to select which of the presses is to be monitored. A display run/hold selector switch 122 and a master display on/off selector switch 124 are also provided on the face of the control panel 110 so as to control the individual counters in a manner similar to that described above.

As seen in FIG. 6a, the remote control panel 110 has mounted therein a plurality of counter circuits 126, 128 and 130 which are identical to the counter circuits shown in FIGS. 2 and 4 and described above. The counters 126, 128 and 130 again have associated therewith multi-digit displays 116, 112 and 114, respectively, for providing count information relating to the speed of a press as well as the number of good and waste parts produced by that press. The inputs to the counters 126, 128 and 130 are similar to the input control circuitry described above or counters 32, 34 and 36, shown in FIGS. 2 and 4 and, such, the details of the input control circuitry will not be described herein. The anode and cathode driver outputs from the counters 126, 128 and 130 are input to a plurality of tri-state buffer circuits, indicated generally by reference numbers 132, 134 and 136, respectively, as shown in FIG. 6b. Each tri-state buffer 132, 134 and 136 is essentially an on-off switch which is selected by an input from the press selector switch 120.

It should be noted at this point that each press that is to be monitored has associated therewith identical circuitry as that shown in FIG. 6a. Thus, the press selector switch 120, illustrated in FIGS. 5 and 6b, may select one of a multitude of presses, such as one of four in the embodiment illustrated in FIG. 5, to be monitored. The output of the press selector switch 120 will thus select the tri-state buffers associated with the particular press that is to be monitored. Appearing on the output of the tri-state buffers 132, 134 and 136 associated with the press to be monitored will be the anode and cathode output signals from the respective speed, good part and waste part counters, such as counters 126, 128 and 130, shown in FIG. 6a. The anode and cathode control signals are connected to common busses with corresponding control signals from the tri-state buffers associated with the remainder of the presses that are monitored. The common busses are connected to the corresponding display, such as displays 112, 114 and 116, shown in FIGS. 5 and 6b, to thereby indicate the number of good and bad parts produced as well as the speed of the press selected by the press selector switch 120 on the remote control panel 110. In addition, the reference number of the press selected is displayed in display 118. Associated with each element of the press number display 118 are a plurality of BCD-to-seven segment decoders 134 and tri-state buffers 136. One decoder 134 and one tri-state buffer 136 cooperate as a pair to drive the appropriate segment of one display element so as to display the selected digit. The number displayed is selected by connecting the appropriate number of jumpers 138 to the inputs of the tri-state buffers 136 so as to program the buffers 136. The associated decoder 134, which receives at its inputs the BCD value from the tri-state buffer 136, decodes the BCD number to the correct number of control signals to drive the segments of the display element and display the programmed digit of the press reference number. The outputs from each decoder 134 are bussed together with similar outputs from the other decoders 134 so as to enable a plurality of distinct digits to be selected by the press number selector switch 120 which enables the appropriate tri-state buffer 136 to display the number of a particular press to be monitored. It should be noted that identical circuitry is associated with each digit of the display 118 so as to enable a plurality of distinct press reference numbers to the selected and displayed.

In summary, there has been disclosed herein new and improved production counter apparatus suitable for use as a production counter in a manufacturing operation. The counter apparatus includes a plurality of identical electronic counter circuits, each operative to provide a count of the number of occurrences of a different production event, such as good and waste parts, total parts, or the speed of a particular machine. Digital displays associated with each counter display the respective counts of the different manufacturing operations.

The individual electronic counter circuits are mounted in a main control panel located adjacent to a particular machine so as to provide a convenient means of observing the count information as well as controlling the operation of the counter apparatus. Further, additional counter circuits may be disposed in a control panel located remote from a particular machine so as to provide for supervision of a plurality of individual machines. In this manner, the sensitive electronic components forming the counting apparatus are protected from the heat and vibrations associated with the machines utilized in manufacturing plant operations. Furthermore, the electronic components utilized to construct the electronic counting apparatus of this invention provide improved reliability and higher accuracy regarding production part count information than the conventional mechanical type counters utilized extensively in the past.

What is claimed is:

1. Counting apparatus for a production machine producing parts having a plurality of distinct states, said counting apparatus comprising:
   means for detecting the production of a part:
   first switch means, responsive to operator selection, for selecting between each of said plurality of distinct states of said produced part;
   a plurality of electronic counter means, each responsive to said detecting means and said first switch means, for respectively counting the number of occurrences of one of said distinct states of said produced parts; and
   a plurality of display means, each responsive to one of said counter means, for displaying the current number of occurrences of one of said distinct states of said produced part;
   second switch means switchable between first and second positions; and wherein
   each counter means is responsive to said second switch means to hold the output signals transferred from said counter means to said display means at the state present when said second switch means is switched to said first position;
   each of said counter means continuing to count the number of parts produced of a particular distinct state after said second switch means is switched to said first position so as to provide to the display means the total number of parts produced of a particular distinct state when said second switch means is switched to said second position.

2. The counting apparatus of claim 1 wherein the first switch means comprises a selector switch switchable between a plurality of positions, each corresponding to one of the distinct states of the selected event.

3. The counting apparatus of claim 2, wherein the selector switch is located remote from the counter means.

4. The counting apparatus of claim 1 wherein the distinct states include good and waste parts produced by said machine.

5. The counting apparatus of claim 1 further including:
   input means for detecting the speed of operation of the machine;

counter means, responsive to said input means, for determining the speed of operation of said machine; and display means, responsive to said speed determining counter means, for displaying the speed of said machine.

6. A production counter apparatus comprising:

first input means for detecting the production of parts produced on a machine;

first switch means, responsive to manual operator selection, for providing output signals respectively indicative of good and waste part production on said machine;

first electronic counter means, responsive to said first input means for counting the number of occurrences of the production of parts, second and third electronic counter means, responsive to said first input means and said first switch means, for counting the number of occurrences of the production of good parts and the production of waste parts, respectively;

first, second and third digital means, one of which is associated with and responsive to each of said first, second and third counter means for displaying the current total number of occurrences of parts, good parts and waste parts produced, respectively; and second switch means switchable between first and second positions;

and wherein each counter means is responsive to said second switch means to hold the output signals transferred from said counter means to display means at the state present when said second switch means is switched to said first position;

each of said counter means continuing to count the production of parts so as to provide the total number of parts, good parts and waste parts produced, when said second switch means is switched to said second position.

* * * * *